US006552529B1

(12) United States Patent
Fasano et al.

(10) Patent No.: US 6,552,529 B1
(45) Date of Patent: Apr. 22, 2003

(54) METHOD AND APPARATUS FOR INTERIM ASSEMBLY ELECTRICAL TESTING OF CIRCUIT BOARDS

(75) Inventors: Benjamin V. Fasano, New Windsor, NY (US); Mark G. Courtney, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/022,270

(22) Filed: Dec. 17, 2001

(51) Int. Cl.[7] .............................................. G01R 27/08
(52) U.S. Cl. ........................ 324/158.1; 324/715; 438/12
(58) Field of Search ........................... 324/158.1, 693, 324/715, 718, 719, 721; 438/5, 10, 12, 14, 17; 257/913, 711; 702/35

(56) References Cited

U.S. PATENT DOCUMENTS

| 4,783,625 A | 11/1988 | Harry et al. ............. 324/158 P |
| 5,455,458 A | * 10/1995 | Quon ......................... 257/714 |
| 5,471,151 A | 11/1995 | DiFrancesco .............. 324/757 |
| 5,506,514 A | 4/1996 | Difrancesco ............... 324/757 |
| 5,517,515 A | 5/1996 | Spall et al. ................ 371/22.5 |
| 5,642,055 A | 6/1997 | Difrancesco ............... 324/757 |
| 5,929,646 A | 7/1999 | Patel et al. ................. 324/754 |
| 5,949,239 A | 9/1999 | Rezvani et al. ............. 324/754 |
| 6,064,215 A | 5/2000 | Kister ....................... 324/754 |
| 6,094,059 A | 7/2000 | Frankeny et al. .......... 324/757 |
| 6,094,060 A | 7/2000 | Frankeny et al. .......... 324/760 |
| 6,388,535 B1 | * 5/2002 | Otsuki ....................... 331/177 |

* cited by examiner

Primary Examiner—Kamand Cuneo
Assistant Examiner—Trung Nguyen
(74) Attorney, Agent, or Firm—James J. Cioffi (57) ABSTRACT

A method and a structure for assembling a circuit board whereby high temperature attach devices can be electrically tested prior to the joining of permanent low temperature attach devices. A test interposer, with low temperature attach known good reference devices, is placed in electrical contact with the circuit board containing high temperature attach devices. The test interposer/circuit board assembly can be used to identify any defective high temperature attach devices which can be replaced prior to joining the permanent low temperature attach devices on the circuit board. This partial interim test, when only the high temperature attach devices are mounted on the circuit board, eliminates the need to remove known good low temperature attach devices from the circuit board during the high temperature attach device rework process.

18 Claims, 5 Drawing Sheets

METHOD AND APPARATUS FOR INTERIM ASSEMBLY ELECTRICAL TESTING OF CIRCUIT BOARDS

BACKGROUND OF THE INVENTION

The present invention is directed to electronic packaging and, more particularly, is directed to a method and apparatus for the interim testing of high temperature attach devices prior to the permanent attachment of low temperature attach devices on the same circuit board.

Solder reflow technology involves the use of solder reflow to make permanent, low resistance connections to produce a metallic contact of moderate strength. This technique requires that the bonded surfaces be subjected to high temperatures. A solder bond is a permanent bond and reworking a circuit board assembly to remove and replace a defective device subjects the entire assembly to elevated temperatures.

A circuit board typically contains contact pads that align with the contact pads on the device to be joined. Solder balls or solder bumps, typically a lead tin alloy, may be formed on either the device contact pads, the circuit board contact pads, or both. Alternatively, solder pastes may also be used. The surface mount device is then placed on the circuit board and the entire assembly is heated until the solder balls flow and form a good electrical connection between the contact pads. The array of solder balls thus serve as an interconnect mechanism between the contact pads on the device and the contact pads on the circuit board.

During the assembly of surface mount devices onto circuit boards such as ceramic or organic substrates, some devices may need assembly with different solder attach techniques and temperatures. If a high temperature attach device is not testable until a lower temperature attach device is mounted on the circuit board, and the high temperature attach device is found to be defective, all the low temperature attach devices must be removed before the defective high temperature attach device can be removed and replaced.

Ideal assembly processing would be to have all the devices joined at one temperature and through one common elevated temperature cycle. In this situation if a device requires replacement all the devices can sustain the temperature needed to remove the defective devices. Problems arise when devices attached at different temperatures are joined and the high temperature attach devices are found to be defective after circuit board electrical testing. Typically all the low temperature attach devices are removed, the high temperature attach devices are replaced and all the low temperature attach devices are joined again. It is necessary to remove the low temperature join devices because they cannot withstand the high temperature required to reflow the high temperature join devices. This can be very expensive and result in long rework cycles and the waste of good devices. If the circuit board could be tested early with only the high temperature attach devices joined, then any high temperature attach devices found defective could be reworked using conventional means before joining the low temperature attach devices. However, some circuit board testing requires the low temperature attach devices to also be present for electrical continuity or circuit tuning and thus need to be electrically connected in their respective positions on the circuit board.

There are a number of solutions proposed by others for electrically interconnecting circuit components. Difrancesco U.S. Pat. No. 5,506,514, the disclosure of which is incorporated by reference herein, describes a method and apparatus for electrically interconnecting circuit components, assemblies and subassemblies. Included are electronic components mounted on probe assemblies. The electronic components are on the opposite surface of the probe assembly from the substrate being tested and are connected by a wire. This does not provide the critical simulation of the device contact pad, RF field effects and other electrical interactions that will actually be present when the device is soldered onto the substrate.

Patel et al., U.S. Pat. No. 5,929,646, the disclosure of which is incorporated by reference herein, describes an apparatus and method to facilitate the testing of semiconductor devices packaged in surface mount modules while the module is connected to a circuit board. This is accomplished using an interposer mechanism that includes a top array of interposer contact pads and a bottom array of interposer contact pads. The reference does not provide for testing partially assembled modules.

Notwithstanding the prior art there remains a need for the direct test of a partially assembled circuit board when only high temperature devices are attached. Accordingly, it is a purpose of the present invention to provide a method and structure that allows the high temperature attach devices to be tested while on the circuit board before the low temperature attach devices are permanently joined thereby minimizing the time and cost of isolating defective high temperature attach devices.

It is another purpose of the present invention to provide a method and structure to allow the placement of low temperature attach devices which simulate the actual low temperature attach devices to be placed onto the circuit board being tested without permanently attaching the low temperature devices to the circuit board.

It is another purpose of the present invention to provide a test interposer which is used to test the circuit board in interim stages of device assembly such that these devices can be evaluated before committing them to solder attachment to the substrate.

These and other purposes of the present invention will become more apparent after referring to the following description considered in conjunction with the accompanying drawings.

BRIEF SUMMARY OF THE INVENTION

The purposes and advantages of the present invention have been achieved by providing, according to a first aspect of the invention a method for assembling a circuit board whereby high temperature attach devices can be electrically tested prior to the joining of permanent low temperature attach devices, the method comprising the steps of:

(a) joining at least one high temperature attach device onto a circuit board;

(b) placing a test interposer with a least one low temperature known good reference device mounted on the test interposer in electrical contact with the circuit board and at least one high temperature attach device;

(c) testing the high temperature attach devices while they are in electrical contact with the low temperature known good reference devices in order to identify any defective high temperature attach devices;

(d) removing the test interposer from the circuit board;

(e) performing the following steps only if a defective high temperature attach device is present:

(i) removing any defective high temperature attach devices if any are present, from the circuit board;

(ii) joining additional high temperature attach devices to replace any defective high temperature attach devices, if any are present;

(iii) placing the test interposer with the low temperature known good reference devices mounted on the test interposer in electrical contact with the circuit board;

(iv) retesting the high temperature attach devices while they are in electrical contact with the low temperature known good reference devices to identify defective high temperature attach devices;

(v) removing the test interposer from the circuit board; and (vi) repeating steps (i) to (v) until no defective high temperature attach devices are present; and (f) joining the permanent low temperature attach devices on the circuit board to complete the circuit board assembly.

According to another aspect of the invention, there is provided a structure for electrically testing the high temperature attach devices on a circuit board prior to the joining of the permanent low temperature attach devices, comprising:

a circuit board;

at least one high temperature attach device joined on the circuit board;

a test interposer;

cutout areas in the test interposer corresponding to the size and location of the high temperature attach devices on the circuit board; and at least one low temperature known good reference device mounted on the test interposer, the test interposer in electrical contact with the circuit board.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows in conjunction with the accompanying drawings in which:

DETAILED DESCRIPTION OF THE INVENTION

One method often employed for attaching electronic devices, such as semiconductor chips and capacitors, to circuit boards, involves the use of a solder bump which is attached to the underside of the capacitor or chip and which is essentially a ball of solder on a specific wettable electrical contact area. The term "circuit board" is used here as a general term for any platform or package to which electronic devices are joined. The term "circuit board" could also include, for example, ceramic chip carriers, plastic chip carriers or a printed wire board (PWB). In a typical application a semiconductor chip is joined to a circuit board using a high lead solder alloy, for example 97/3 Pb/Sn solder which has a reflow temperature of about 360 degrees C. This is an example of a high temperature attach device.

Figure 1:
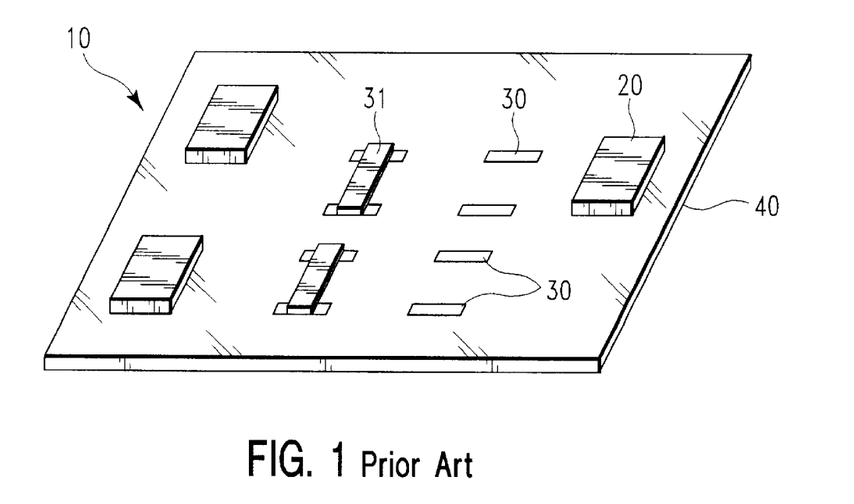
FIG. 1 is a perspective view of a typical circuit board having both low and high temperature attach devices.

There are also devices with lower temperature eutectic solder joins that are processed at about 220 degrees C. Such surface mount technology (SMT) devices such as resistors, capacitors and inductors, are almost universally attached using a eutectic solder. These are examples of low temperature attach devices. Referring to FIG. 1 there is shown an example of a typical circuit board assembly 10 containing both high temperature and low temperature attach devices. The circuit board assembly 10 is comprised of high temperature attach devices 20 and low temperature attach devices 31 mounted on a circuit board 40. The low temperature attach device contact pads 30 are also shown. The number and location of devices shown are arbitrary and are presented for illustrative purposes only.

Figure 2:
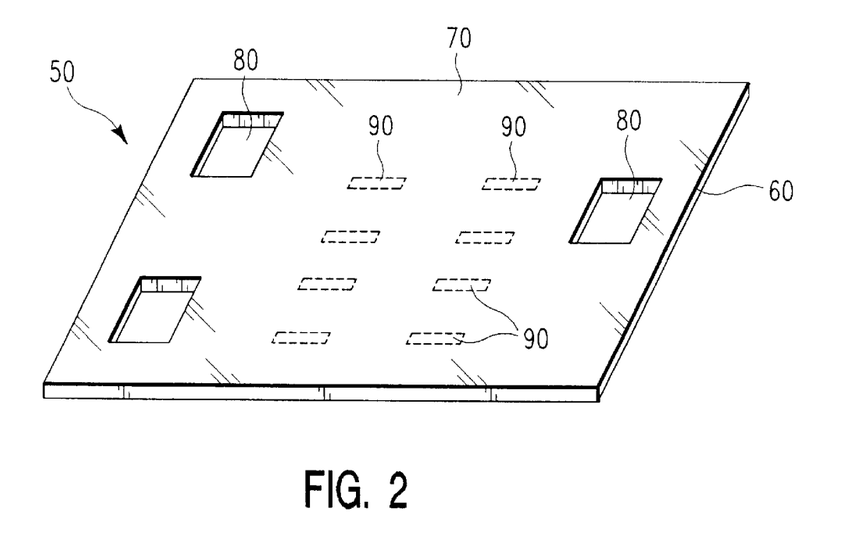
FIG. 2 is a perspective view of the test interposer according to the present invention.

Referring to FIG. 2 there is shown a perspective view of the top surface 70 of the test interposer board 50 according to the present invention. The interposer test board 50 is made from a low dielectric circuit board 60, preferably using a similar dielectric material as the circuit board being tested. For ceramic substrates, the interposer can be made from the same ceramic dielectric as the substrate. The test interposer board 50 contains cutout areas 80. These cutout areas 80 correspond to the size and location of the high temperature attach devices on the circuit board. Typical methods to make cutout areas in a test interposer would include cutting using lasers, green milling of a ceramic test interposer prior to firing, diamond cutting and other abrasive cutting techniques. The test interposer board 50 has contact pads 90, shown as dashed lines in the top surface view 70 of FIG. 2, on the bottom side.

Figure 3A:
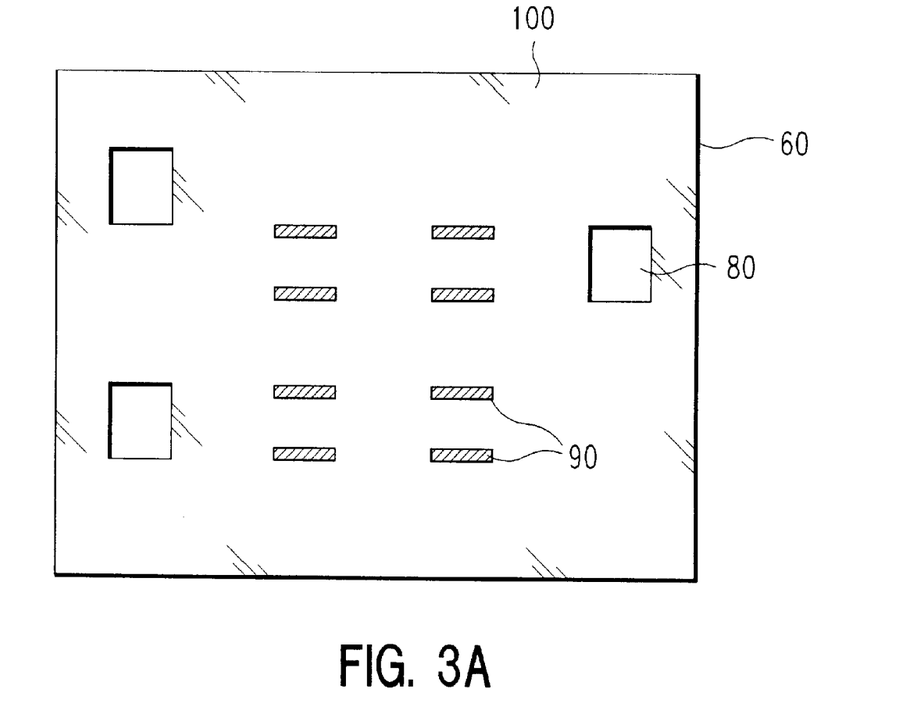
FIG. 3a is a schematic view of the bottom surface of the test interposer.

Referring to FIG. 3(a) there is shown a schematic view of the bottom surface 100 of the test interposer 50. The contact pads 90 allow for the attach of known good low temperature reference devices such as a resistor or capacitor. The contact pads 90 are positioned on the test interposer such that they are near where the actual corresponding low temperature devices on the circuit board will be located once the test interposer is positioned over the circuit board.

Figure 3B:
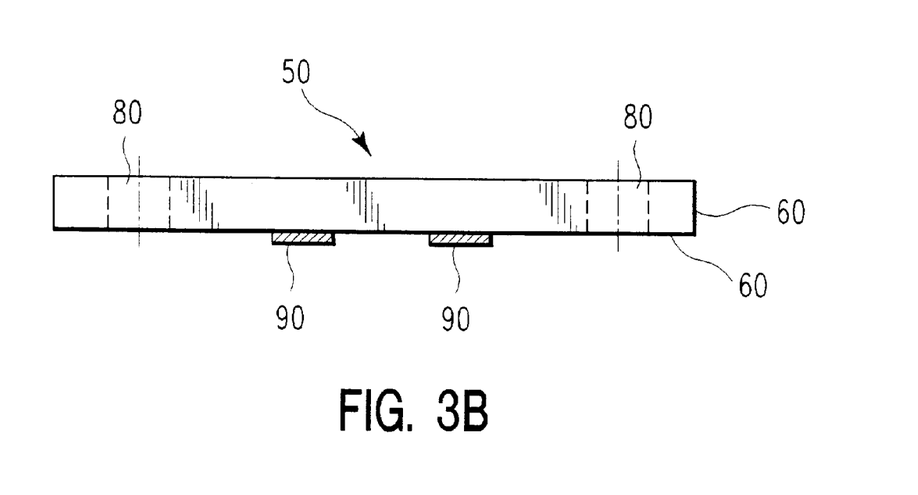
FIG. 3b is a schematic edge view of the test interposer.

FIG. 3(b) is an edge view of the test interposer 50. The top surface 70 is the surface which will not come in contact with the circuit board during test. The bottom surface 100 is the surface which will come in contact with the circuit board during test.

Figure 4:
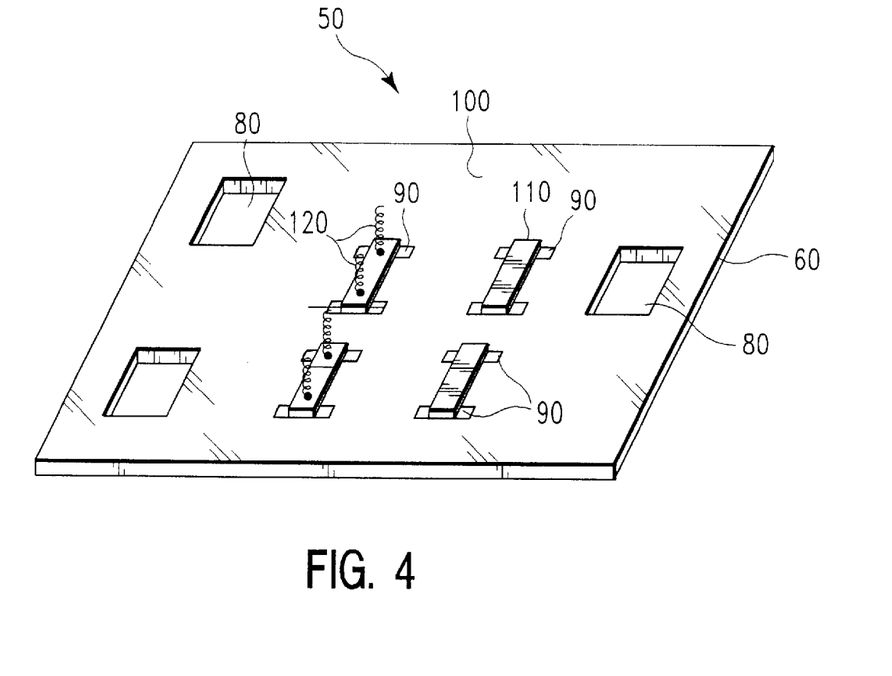
FIG. 4 is a perspective view of the bottom surface of the test interposer with low temperature reference devices attached.

FIG. 4 is a perspective view of the bottom surface of the test interposer 50 with low temperature devices 110 attached. The low temperature devices 110 are preferably known good or "golden" reference devices. In a preferred embodiment the low temperature known good reference devices 110 mounted on the test interposer 50 provide compliant electrical contacts 120 between the contacts on the ends of the devices and their respective pads on the circuit board to simulate their joined electrical presence on the circuit board. The compliant electrical contacts 120 are positioned at the ends of the low temperature known good reference devices 110 so that these can be used to contact the respective contact pads on the partially assembled circuit board. The test interposer 50 is used to test the circuit board in interim stages of device assembly such that the high temperature attach devices can be evaluated before committing the low temperature attach devices to solder attachment on the circuit board.

Still referring to FIG. 4 there is shown a typical low temperature known good reference device 110 mounted on the test interposer 50. A compliant electrical connector 120 is attached to the low temperature known good reference device 110. In this example the compliant electrical connector 120 is a spring. The compliant electrical connector 120 may be metal springs, fingers, conductive polymer devices, or other similar electrically conductive features. The selection of the connector scheme would be based on requirements such as mechanical contact force and surface planarity as well as electrical requirements. For example, a BeCu spring type connector could be used for low impedance connections. The attachment of these conductive features may involve a second attach process on the interposer.

The test interposer 50 allows placement of low temperature known good reference devices 110 which simulate actual devices to be placed onto the circuit board being tested without a hard attach such as solder. The low temperature known good reference devices 110 are oriented onto the test interposer 50 in such a way that they will provide similar electrical and dimensional performance as though they were attached to the circuit board 40.

Mounting the low temperature known good reference devices 110 on the bottom surface 100 of the test interposer 50 allows for critical simulation of the device contact pad, RF field effects and other electrical interactions that will actually be present when the device is soldered onto the circuit board.

The present invention provides for the direct test of a partially assembled circuit board where only high temperature attach devices are mounted on the circuit board. At this stage any defective high temperature attach devices can be routinely replaced and the circuit board retested with new high temperature attach devices using the interposer test board. If all the lower temperature attach devices had been in place on the circuit board they would all have to have been removed before the high temperature attach devices could be reworked. After the defective high temperature attach devices were replaced all the low temperature attach devices would have to be replaced before the circuit board could be tested again. In some applications up to 100 low temperature attach devices are required This could become a repetitive cycle and there is a finite number of reflows the devices and circuit board can undergo before they are damaged or become unreliable.

Figure 5:
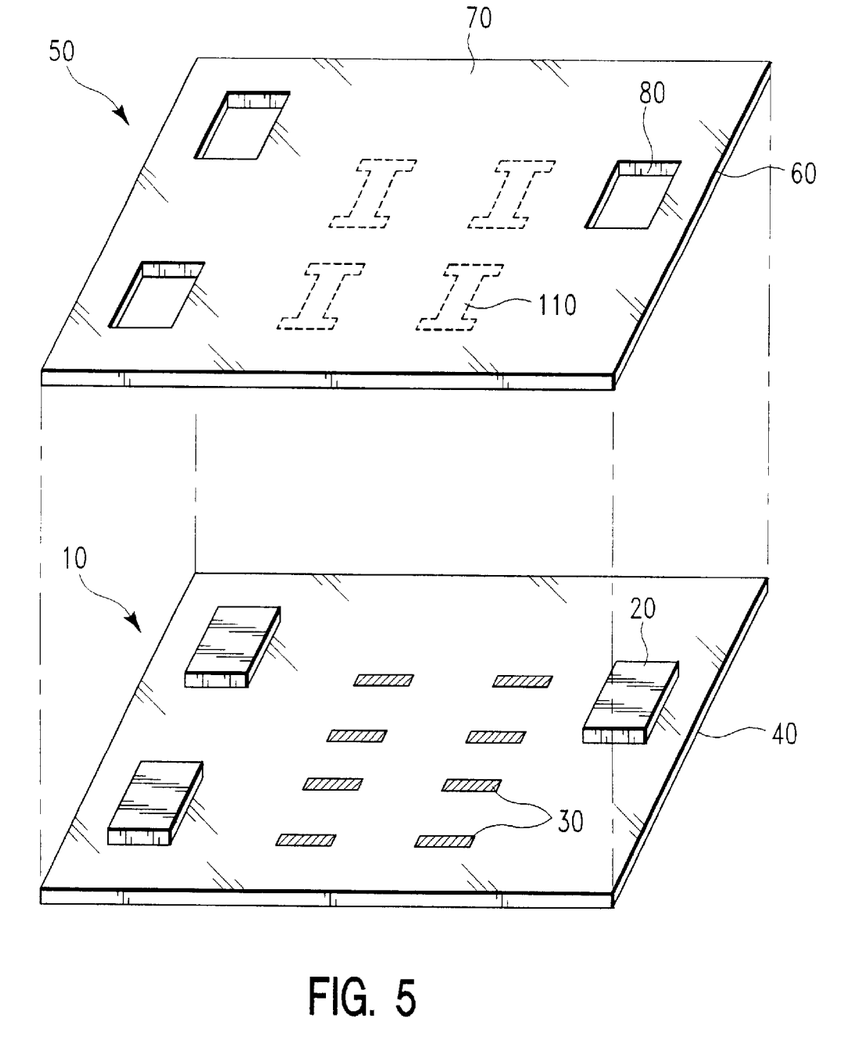
FIG. 5 is a perspective view showing how the test interposer would align with and be placed onto the circuit board.

Referring to FIG. 5 the present invention discloses assembling all the high temperature attach devices 20 onto the circuit board 40 in a single high temperature join cycle. The test interposer 50, with low temperature known good reference devices 110 mounted on the bottom side, is then placed on the circuit board 40. The test interposer 50 has cutouts 80 that fit over the high temperature attach devices 20 on the circuit board 40 and provide clearance to allow the bottom surface 100 of the test interposer 50 to contact, or nearly contact, the circuit board 40. The compliant electrical connectors 120 (shown in FIG. 4) attached to the low temperature known good reference devices 110 electrically contact the pads 30 for the respective low temperature attach devices on the circuit board 40. The circuit board 40 is then tested as though all the low temperature attach devices were permanently mounted on the circuit board 40 using conventional socketing techniques. If all the high temperature attach devices 20 are good, the circuit board 40 proceeds on to the next assembly step of low temperature device attach.

Figure 6:
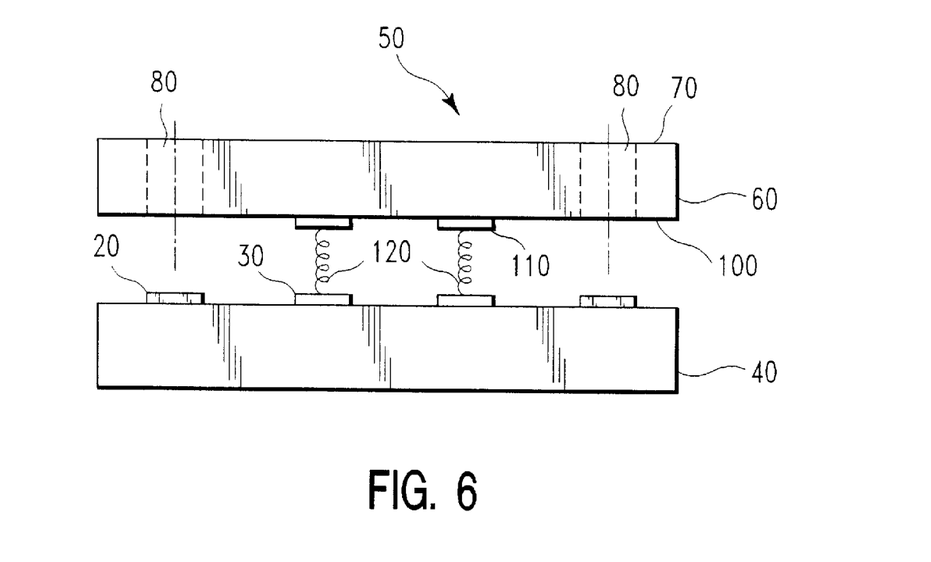
FIG. 6 is an edge view of the test interposer in electrical contact with the circuit board.

The circuit board/interposer test configuration 130 is shown in FIG. 6. While the test interposer 50 and circuit board 40 are shown spaced apart for the sake of clarity, it should be understood that in actuality, test interposer 50 and circuit board 40 would contact or nearly contact each other when fully assembled. The low temperature known good reference devices 110 are mounted on the low dielectric material board 60 of the test interposer 50. The compliant electrical contacts 120 attached to the low temperature known good reference devices 110 provide the low temperature attach pad 30 on the circuit board 40 with device simulation to allow testing of the high temperature attach devices 20. Integrating the low temperature known good reference devices into the interim assembly test to simulate the electrical presence of the low temperature attach devices may be critical in determining the adequacy of the high temperature attach devices. The cutouts 80 for the high temperature attach devices 20 allow for thermal contact if necessary to remove heat during testing or the electrical grounding and shielding of the high temperature attach devices 20 if needed. The high temperature attach devices 20 in each cutout 80 can be capped with a metal shield (not shown) to isolate each device if RF isolation is needed.

If the partial interim test is successful the permanent low temperature attach devices are then joined and the circuit board is again tested without the test interposer. However, if the partial test is not successful because high temperature attach devices are found to be defective, they are reworked and the partial interim testing repeated until a circuit board with all known good high temperature devices can be moved on to have low temperature devices permanently joined.

At high frequency the impact of conventional circuit board materials would be detrimental to the circuitry. Having a very low and rugged ceramic test interposer with cutouts for the devices allows the devices to connect to their respective pads as though they were actually soldered to the circuit board for more accurate testing. In a preferred embodiment the test interposer is a low dielectric material. An example is a cordierite based glass ceramic test interposer using copper lines and conductors. Alternatively, thin film technology may also be used for the conduction lines. The openings in the glass ceramic test interposer would preferably be punched or cut out from the ceramic laminate before sintering, while the interposer is in a soft unfired state, to minimize the edge damage. Alternatively, the cutout could be provided by other techniques such as laser cutting.

In a preferred embodiment the contact pads on the test interposer for the low temperature known good reference devices are solderable gold plated nickel or copper for the lead-tin eutectic join. The compliant connectors used to make temporary electrical contact to the circuit board under test could be a spring or compressible "fuzz buttons" and preferably would be a gold plated leaf spring or finger. The typical contact force is between 10 and 100 grams per contact pad, and preferably about 50 grams per contact pad.

In a preferred embodiment the test interposer used for the interim subassembly electrical test will have the reference components (capacitors, resistors) attached to it via normal eutectic soldering operations. These components are electrically connected through the test interposer to a spring assembly which will act to make electrical contact to the circuit board assembly being tested. This spring assembly should maintain physical compliance, make good electrical contact between the test interposer and the circuit board being tested and is preferably solderable for connection to the test interposer and small enough to engage the contact pad on the circuit board.

Figure 7:
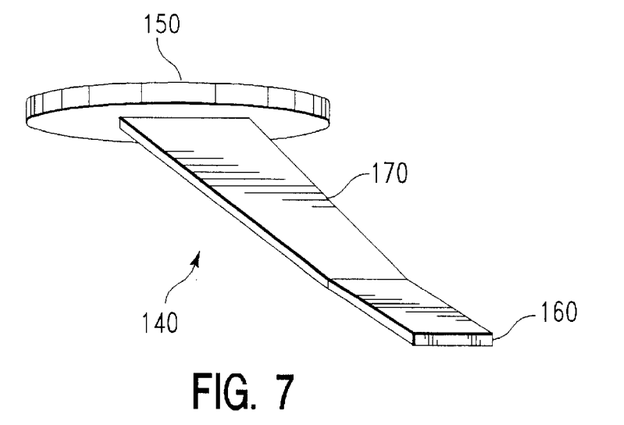
FIG. 7 is a perspective view of a compliant spring connector.

A variety of mechanisms are available for this spring and its assembly. Referring to FIG. 7 there is illustrated a preferred embodiment that has these desirable characteristics. A leaf spring 140 of roughly 0.020 inches dimension is fabricated of beryllium copper. This dimension will vary depending upon the size and pattern of the circuit board contact pads. The leaf spring has a solderable pad 150 at one end and a contact pad 160 at the other end. The solderable pad 150 and contact pad 160 are selectively nickel/gold plated. The solderable pad 150 at one end of the spring solders to the interposer, while the contact pad 160 at the other end provides enhanced surface area to make good electrical contact to the circuit board contact pads. Selectively plating only the solderable pad 150 and contact pad 160 ensures the solder used for connecting to the interposer does not run along the spring body 170 and ruin its mechanical compliance. The electrical contact end is also preferably gold plated for best electrical contact properties.

Figure 8:
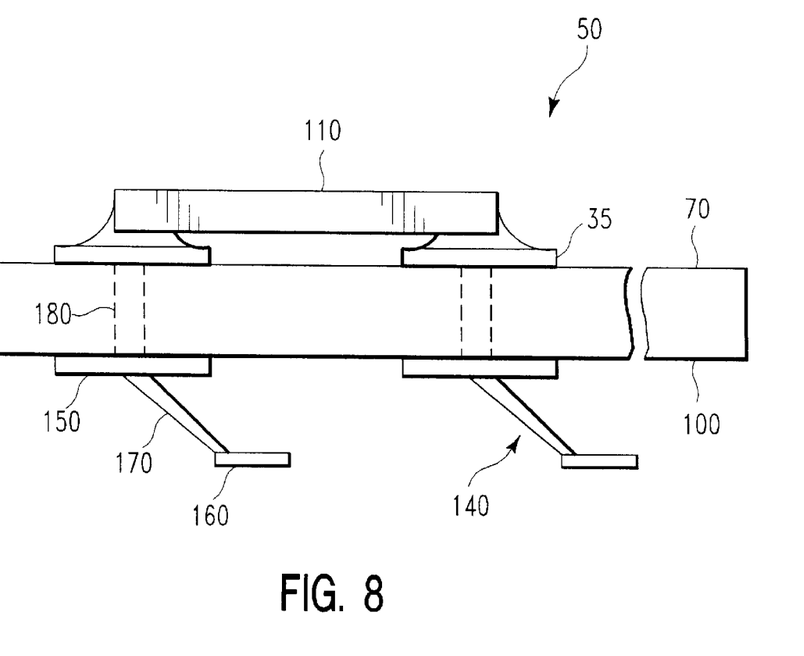
FIG. 8 is a cross section view of the test interposer with the known good reference devices mounted on the top surface of the test interposer.

It is not necessary that the low temperature known good reference device be mounted on the bottom surface of the test interposer. Referring to FIG. 8 there is shown another embodiment of the test interposer 50 where the low temperature known good reference devices 110 are mounted on the top surface 70. In this embodiment the test interposer 50 contains conductive through vias 180 which provide electrical interconnections between the top and bottom of the test interposer 50. The low temperature attach device 110 is joined to contact pads 35 on the top surface 70 on the test interposer. The compliant electrical contact, in this example a leaf spring 140, is joined to the conductive vias 180 on the bottom surface 100 of the test interposer.

This particular embodiment would be preferred in circumstances where there are physical space limitations between the test interposer and the circuit board, or where the size of the compliant electrical contacts is small and precludes fitting the low temperature known good reference devices in this space. For certain applications electrical characteristics may make it more desirable to put the low temperature known good reference devices on the top side, as for example, where shielding is an issue.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for assembling a circuit board whereby high temperature attach devices can be electrically tested prior to the joining of permanent low temperature attach devices, the method comprising the steps of:
   (a) joining at least one high temperature attach device onto a circuit board;
   (b) placing a test interposer with a least one low temperature known good reference device mounted on said test interposer in electrical contact with said circuit board and said at least one high temperature attach device;
   (c) testing said at least one high temperature attach device while said at least one high temperature attach device is in electrical contact with said at least one low temperature known good reference device to identify defective high temperature attach devices;
   (d) removing said test interposer from said circuit board;
   (e) performing the following steps only if a defective high temperature attach device is present:
      (i) removing defective high temperature attach devices if any are present, from said circuit board;
      (ii) joining additional high temperature attach devices to replace defective high temperature attach devices, if any are present;
      (iii) placing said test interposer with said at least one low temperature known good reference device mounted on said test interposer in electrical contact with said circuit board;
      (iv) retesting said at least one high temperature attach device while said at least one high temperature attach device is in electrical contact with said at least one low temperature known good reference device to identify defective high temperature attach devices;
      (v) removing said test interposer from said circuit board; and
      (vi) repeating steps (i) to (v) until no defective high temperature attach devices are present; and
   (f) joining at least one permanent low temperature attach device on said circuit board to complete the circuit board assembly.

2. The method of claim 1 wherein said at least one high temperature attach device is a semiconductor chip joined to said circuit board using a high lead solder at approximately 360° C.

3. The method of claim 1 wherein said at least one permanent low temperature attach device is a surface mount technology (SMT) device joined using a eutectic Pb/Sn solder at a approximately 220° C.

4. A structure for electrically testing the high temperature attach devices on a circuit board prior to the joining of the permanent low temperature attach devices, comprising:
   a circuit board;
   at least one high temperature attach device joined on said circuit board;
   a test interposer;
   cutout areas in said test interposer corresponding to the size and location of said at least one high temperature attach device on said circuit board;
   at least one low temperature known good reference device mounted on said test interposer and connected to at least one compliant connector for making electrical contact to said circuit board, said test interposer in electrical contact with said circuit board, and
   said test interposer further comprising conductive vias and said at least one low temperature known good reference device is mounted on a surface of said test interposer which is not contiguous with said circuit board.

5. The structure of claim 4 wherein said cutout areas are formed in said test interposer using a laser.

6. The structure of claim 4 wherein said cutout areas are formed in said test interposer using diamond cutting.

7. The structure of claim 4 wherein said test interposer is a ceramic and said cutout areas are formed in said test interposer by green milling prior to firing said test interposer.

8. The structure of claim 4 wherein said test interposer is a low dielectric material.

9. The structure of claim 4 wherein said at least one compliant connector is a metal spring.

10. The structure of claim 4 wherein said at least one compliant connector is a conductive polymer structure.

11. The structure of claim 4 wherein said at least one compliant connector is a compressible fuzz button connector.

12. The structure of claim 4 wherein said at least one compliant connector is a gold plated leaf spring.

13. The structure of claim 4 wherein said test interposer contains gold plated nickel contact pads.

14. The structure of claim 4 wherein said test interposer contains copper contact pads.

15. The structure of claim 4 wherein said at least one low temperature known good reference device is mounted on a surface of said test interposer contiguous with said circuit board.

16. The structure of claim 4 wherein said circuit board is a ceramic chip carrier.

17. The structure of claim 4 wherein said circuit board is a plastic chip carrier.

18. The structure of claim 4 wherein said circuit board is a printed wire board (PWB).

* * * * *